United States Patent
Kwon et al.

[19]

[11] Patent Number: 5,907,516
[45] Date of Patent: *May 25, 1999

[54] SEMICONDUCTOR MEMORY DEVICE WITH REDUCED DATA BUS LINE LOAD

[75] Inventors: Geoun Tae Kwon; Yong Chul Cho, both of Kyoungkido, Rep. of Korea

[73] Assignee: Hyundai Electronics Industries Co., Ltd., Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/889,332

[22] Filed: Jul. 8, 1997

Related U.S. Application Data

[63] Continuation-in-part of application No. 08/499,390, Jul. 7, 1995, abandoned.

[30] Foreign Application Priority Data

Jul. 7, 1994 [KR] Rep. of Korea .................. 1994-16356

[51] Int. Cl.$^6$ ....................................................... G11C 7/00
[52] U.S. Cl. ...................................... 365/203; 365/230.03
[58] Field of Search .............................. 365/230.03, 205, 365/207, 208, 203, 190

[56] References Cited

U.S. PATENT DOCUMENTS

| | | | |
|---|---|---|---|
| 4,799,197 | 1/1989 | Kodama | 365/205 |
| 4,991,142 | 2/1991 | Wang | 365/208 |
| 5,016,224 | 5/1991 | Tanaka et al. | 365/230.03 |
| 5,243,574 | 9/1993 | Ikeda | 365/207 |
| 5,444,305 | 8/1995 | Matsui | 365/207 |

FOREIGN PATENT DOCUMENTS

| | | |
|---|---|---|
| 0166642 | of 0000 | European Pat. Off. |
| 2246001 | of 0000 | United Kingdom . |

*Primary Examiner*—Son Mai
*Attorney, Agent, or Firm*—Blakely Sokoloff Taylor & Zafman

[57] ABSTRACT

A semiconductor memory device having a plurality of memory blocks for storing data, and a plurality of sense amplifiers for sensing the data stored in the plurality of memory blocks. The semiconductor memory device comprises data bus lines for transferring the data sensed by the plurality of sense amplifiers. The data bus lines are divided into first and second parts. The semiconductor memory device further comprises a data bus line load reduction circuit for selecting one of the divided first and second data bus line parts in response to first and second data bus line control signals. The selected data bus line part inputs the data from one of the plurality of memory blocks selected in response to a memory block address. The other data bus line part, not selected, has a minimized load. The first and second data bus line control signals are produced in response to a most significant bit of the memory block address.

9 Claims, 5 Drawing Sheets

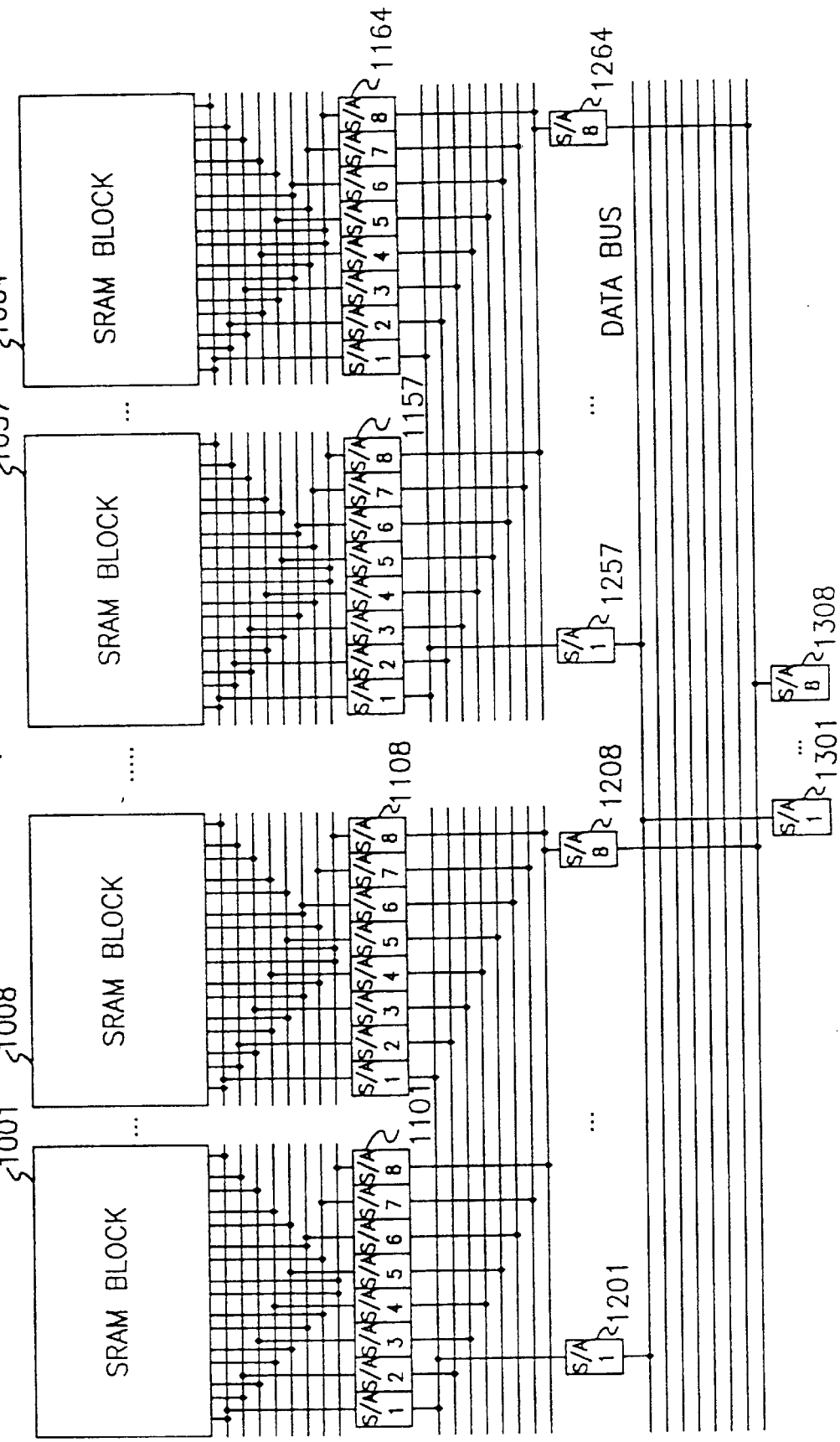

SEMICONDUCTOR MEMORY DEVICE WITH REDUCED DATA BUS LINE LOAD

This is a continuation-in-part of application Ser. No. 08/499,390 filed Jul. 7, 1995, abandoned.

BACKGROUND OF THE INVENTION

1. Field of the Invention

The present invention relates to a semiconductor memory device which is capable of reducing a data bus line load to enhance a data transfer speed.

2. Description of the Prior Art

Generally, data bus lines are included for data transfer in semiconductor memory devices such as a dynamic random access memory, a static random access memory, a read only memory and the like. The data bus lines have loads such as a routing capacitance, a fringing capacitance, a sheet resistance and the like, resulting in a delay in the data transfer. The routing capacitance is commonly called an intrinsic capacitance and produced between the data bus lines and a semiconductor substrate. The fringing capacitance is commonly called a coupling capacitance and produced between adjacent ones of the data bus lines.

A conventional 16M (mega) static random access memory (referred to hereinafter as SRAM) will hereinafter be mentioned with reference to FIG. 1.

Referring to FIG. 1, there is shown, in block form, the conventional 16M SRAM. As shown in this drawing, the conventional 16M SRAM comprises 64 memory blocks 1001–1064, each of which has a memory capacity of 256K bits. That is, each of the 64 memory blocks 1001–1064 includes 128 memory cells in the horizontal direction and 2048 memory cells in the vertical direction. Generally, as the semiconductor memory device becomes larger in scale, the bit line loads such as the sheet resistance, the routing capacitance, the fringing capacitance and the coupling capacitance are increased. The increased bit line loads have a bad effect on the data input and output, resulting in a limitation in the number of memory cells in one memory block. For this reason, the semiconductor memory device comprises a plurality of memory blocks. Here, the coupling capacitance signifies a capacitance produced at a contact point between the bit line and the memory cell.

The conventional 16M SRAM further comprises 64 first-stage sense amplifier arrays 1101–1164, each of which senses eight output bits from a corresponding one of the memory blocks 1001–1064. Here, the number of the output bits from each of the memory blocks 1001–1064 is 8 as an example, which may be different according to the type of the semiconductor memory device.

The conventional 16M SRAM further comprises 64 second-stage sense amplifiers 1201–1264 for sensing output bits from the first-stage sense amplifier arrays 1101–1164 in the unit of 8 bits by weight, respectively. Output bits from the second-stage sense amplifiers 1201–1264 are placed on eight data bus lines in the unit of 8 bits by weight. The conventional 16M SRAM further comprises eight third-stage sense amplifiers 1301–1308 for sensing bits on the corresponding data bus lines, respectively. The data bus lines have such long lengths as to input the cell data from all the memory blocks 1001–1064.

As a result, as the semiconductor memory device becomes larger in scale, the data bus line is increased in length, resulting in an increase in the load. The increased load of the data bus line causes a delay in the data transfer. Further, in order to drive the data bus line with the increased load, the sense amplifier must be increased in size. The increased size of the sense amplifier reduces a data sensing speed thereof and increases a lay-out area thereof.

In this connection, a data bus line load reduction circuit is required to reduce the data bus line load, so as to increase the data transfer speed and reduce the lay-out area of the sense amplifier.

SUMMARY OF THE INVENTION

Therefore, the present invention has been made in view of the above problem, and it is an object of the present invention to provide a semiconductor memory device which is capable of reducing a data bus line load to increase a data transfer speed and reduce a lay-out area of a sense amplifier.

In accordance with an aspect of the present invention, there is provided a semiconductor memory device having a plurality of memory blocks for storing data, and a plurality of sense amplification means for sensing the data stored in said plurality of memory blocks, comprising: data bus lines for transferring the data sensed by said plurality of sense amplification means, said data bus lines being divided into first and second parts; and data bus line load reduction means for selecting one of said divided first and second data bus line parts in response to first and second data bus line control signals so that the selected data bus line part can input the data from one of said plurality of memory blocks selected in response to a memory block address and the other data bus line part, not selected, can have a minimized load, the first and second data bus line control signals being produced in response to a most significant bit of the memory block address, wherein said data bus line load reduction means includes: a plurality of first switching means, each of said plurality of first switching means selecting a corresponding one of said data bus lines of said first data bus line part when the first data bus line control signal remains at its inactive state; a plurality of second switching means, each of said plurality of second switching means selecting a corresponding one of said data bus lines of said second data bus line part when the second data bus line control signal remains at its inactive state; a plurality of first equalizing means, each of said plurality of first equalizing means equalizing a corresponding one of said data bus lines of said first data bus line part when the first data bus line control signal remain at its active state; and a plurality of second equalizing means, each of said plurality of second equalizing means equalizing a corresponding one of said data bus lines of said second data bus line part when the second data bus line control signal remain at its active state.

In accordance with another aspect of the present invention, there is provided a semiconductor memory device having a plurality of memory blocks for storing data, and a plurality of sense amplification means for sensing the data stored in said plurality of memory blocks, comprising: a plurality of data bus line pairs for transferring the data sensed by said plurality of sense amplification means, said pairs of data bus lines being divided into first and second parts; a plurality of switching means for coupling one of said divided first and second data bus line parts to a sensing means in response to first and second data bus line control signals so that the selected data bus line part can input the data from one of said plurality of memory blocks selected in response to a memory block address, wherein the first and second data bus line control signals being produced in response to a most significant bit of the memory block address; and a plurality of equalizing means connected between two data lines in said data bit line pair for reducing a load on said unselected data bus line part.

BRIEF DESCRIPTION OF THE DRAWINGS

The above and other objects, features and advantages of the present invention will be more clearly understood from the following detailed description taken in conjunction with the accompanying drawings, in which:

FIG. 1 is a block diagram of a conventional 16M SRAM;

DETAILED DESCRIPTION OF THE PREFERRED EMBODIMENTS

Now, a 16M SRAM with a data bus line load reduction circuit in accordance with an embodiment of the present invention will be described in detail with reference to FIGS. 2A and 2B.

Figure 2A:
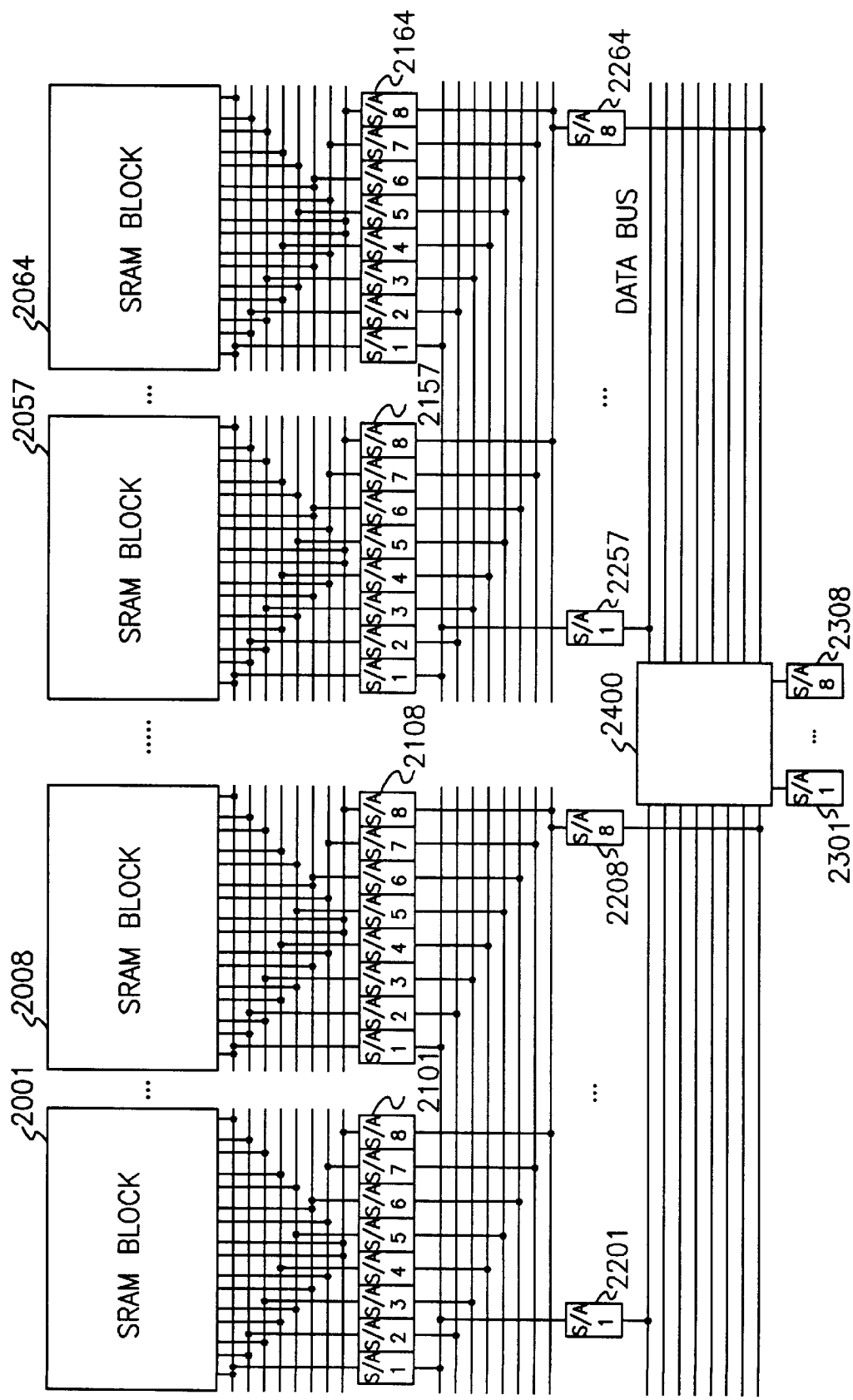
FIG. 2A is a block diagram of a 16M SRAM in accordance with an embodiment of the present invention.

Referring to FIG. 2A, there is shown a block diagram of the 16M SRAM in accordance with the embodiment of the present invention. As shown in this drawing, the 16M SRAM comprises 64 memory blocks 2001–2064, each of which has a memory capacity of 256K bits. That is, each of the 64 memory blocks 2001–2064 includes 128 memory cells in the horizontal direction and 2048 memory cells in the vertical direction.

The 16M SRAM further comprises 64 first-stage sense amplifier arrays 2101–2164, each of which senses eight output bits from a corresponding one of the memory blocks 2001–2064. Here, the number of the output bits from each of the memory blocks 2001–2064 is 8 as an example, which may be different according to the type of the semiconductor memory device.

The 16M SRAM further comprises 64 second-stage sense amplifiers 2201–2264 for sensing output bits from the first-stage sense amplifier arrays 2101–2164 in the unit of 8 bits by weight, respectively. Output bits from the second-stage sense amplifiers 2201–2264 are placed on eight data bus lines in the unit of 8 bits by weight.

The data bus lines are divided into two parts. Namely, the first data bus line part corresponds to the first to 32nd memory blocks and the second data bus line part corresponds to the 33rd to 64th memory blocks. The data bus line load reduction circuit 2400 is connected between the first and second data bus line parts to select one thereof.

The 16M SRAM further comprises eight third-stage sense amplifiers 2301–2308 for sensing bits on the data bus line part selected by the data bus line load reduction circuit 2400, respectively.

Figure 2B:
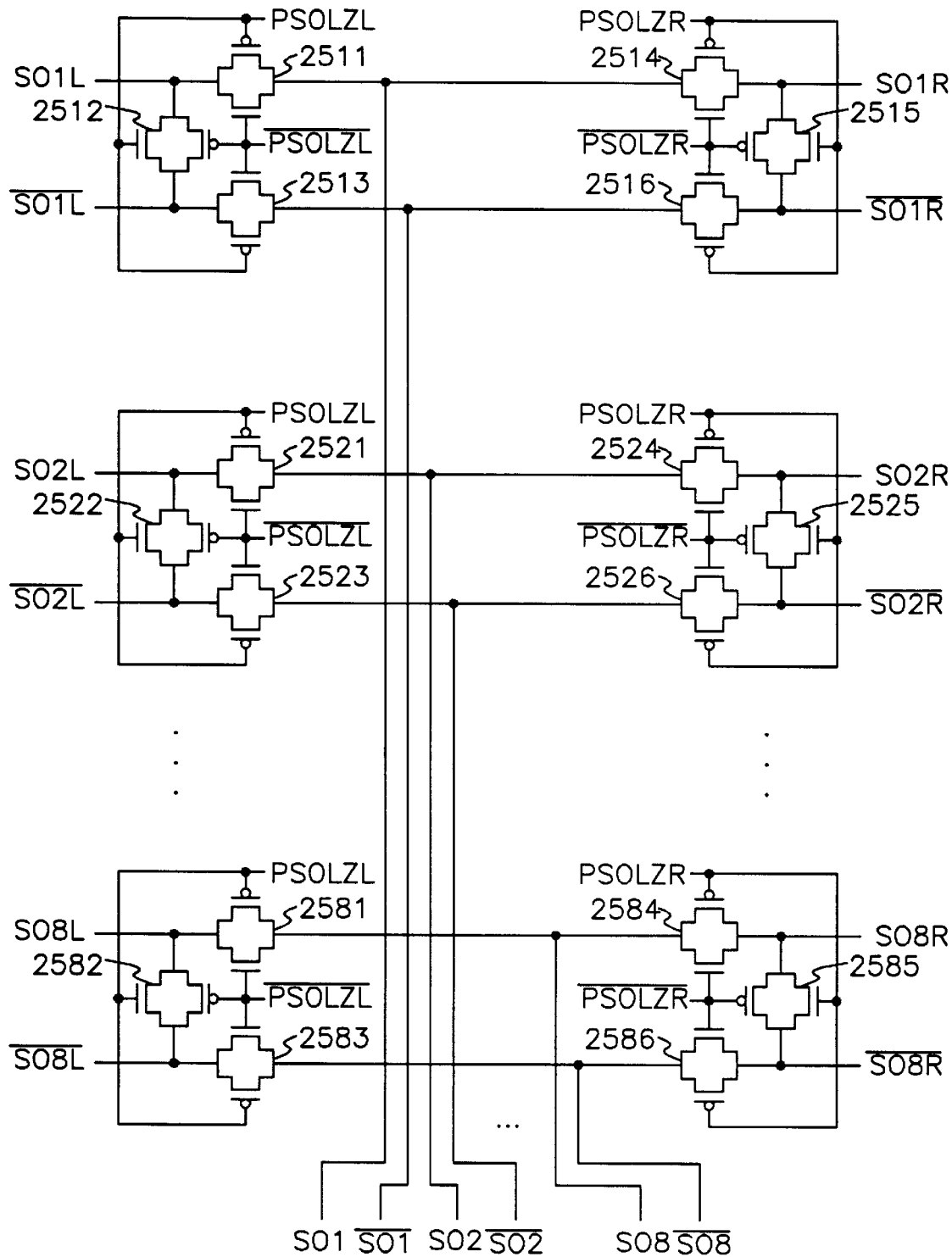
FIG. 2B is a detailed circuit diagram of a data bus line load reduction circuit in FIG. 2A.

Referring to FIG. 2B, there is shown a detailed circuit diagram of the data bus line load reduction circuit 2400 in FIG. 2A. In this drawing, the reference numerals SO1L to SO8L and /SO1L to /SO8L designate the data bus lines of the first part, respectively, and the reference numerals SO1R to SO8R and /SO1R to/SO8R designate the data bus lines of the second part, respectively. In the first data bus line part, the data bus line SOL and the data bus line /SOL are complementary to each other to transfer complementary bits. Similarly, in the second data bus line part, the data bus line SOR and the data bus line /SOR are complementary to each other to transfer complementary bits.

As shown in FIG. 2B, the data bus line load reduction circuit 2400 comprises a plurality of CMOS transistors 2511–2586, each of which is formed by coupling a drain and a source of a p-type metal oxide semiconductor (referred to hereinafter as PMOS) transistor with a drain and a source of an n-type metal oxide semiconductor (referred to hereinafter as NMOS) transistor. Each pair of the complementary data bus lines corresponds to six of the CMOS transistors 2511–2586. In each of the CMOS transistors 2511, 2513, 2521, 2523, . . . , 2581 and 2583, a first data bus line control signal PSOLZL is applied to a gate of the PMOS transistor and a first data bus line control bar signal /PSOLZL is applied to a gate of the NMOS transistor. The drains of the PMOS and NMOS transistors are connected in common to a corresponding one of the data bus lines SO1L–SO8L and /SO1L–/SO8L of the first part. The sources of the PMOS and NMOS transistors are connected in common to a corresponding one of the third-stage sense amplifiers 2301–2308. Similarly, in each of the CMOS transistors 2514, 2516, 2524, 2526, . . . , 2584 and 2586, a second data bus line control signal PSOLZR is applied to a gate of the PMOS transistor and a second data bus line control bar signal /PSOLZR is applied to a gate of the NMOS transistor. The drains of the PMOS and NMOS transistors are connected in common to a corresponding one of the data bus lines SO1R–SO8R and /SO1R–/SO8R of the second part. The sources of the PMOS and NMOS transistors are connected in common to a corresponding one of the third-stage sense amplifiers 2301–2308. Each of the third-stage sense amplifiers 2301–2308 senses a corresponding one of output bits SO1–SO8 and /SO1–/SO8 from the CMOS transistors 2511–2586 in the data bus line load reduction circuit 2400.

The CMOS transistors 2512, 2522, . . . , 2582 are adapted to equalize the complementary data bus lines of the first part, respectively. Namely, in each of the CMOS transistors 2512, 2522, . . . , 2582, the drains of the PMOS and NMOS transistors are connected in common to a corresponding one of the data bus lines SO1L–SO8L of the first part. The sources of the PMOS and NMOS transistors are connected in common to a corresponding one of the data bus lines /SO1L–/SO8L of the first part. The first data bus line control signal PSOLZL is applied to the gate of the NMOS transistor and the first data bus line control bar signal /PSOLZL is applied to the gate of the PMOS transistor.

Similarly, the CMOS transistors 2515, 2525, . . . , 2585 are adapted to equalize the complementary data bus lines of the second part, respectively. Namely, in each of the CMOS transistors 2515, 2525, . . . , 2585, the drains of the PMOS and NMOS transistors are connected in common to a corresponding one of the data bus lines SO1R–SO8R of the second part. The sources of the PMOS and NMOS transistors are connected in common to a corresponding one of the data bus lines /SO1R–/SO8R of the second part. The second data bus line control signal PSOLZR is applied to the gate of the NMOS transistor and the second data bus line control bar signal /PSOLZR is applied to the gate of the PMOS transistor.

The first and second data bus line control signals PSOLZL and PSOLZR are produced by properly combining a most significant bit of a memory block address, an equalizing signal and a second-stage sense amplifier enable signal, as will be mentioned in detail later in conjunction with the operation of the data bus line load reduction circuit 2400.

Noticeably, each of the equalizing CMOS transistors 2512, 2522, . . . , 2582, 2515, 2525, . . . , 2585 equalizes the corresponding data bus line when it is not selected. Therefore, the data input and output can be stably performed.

The operation of the data bus line load reduction circuit 2400 will hereinafter be described in detail with reference to FIG. 3.

Figure 3:
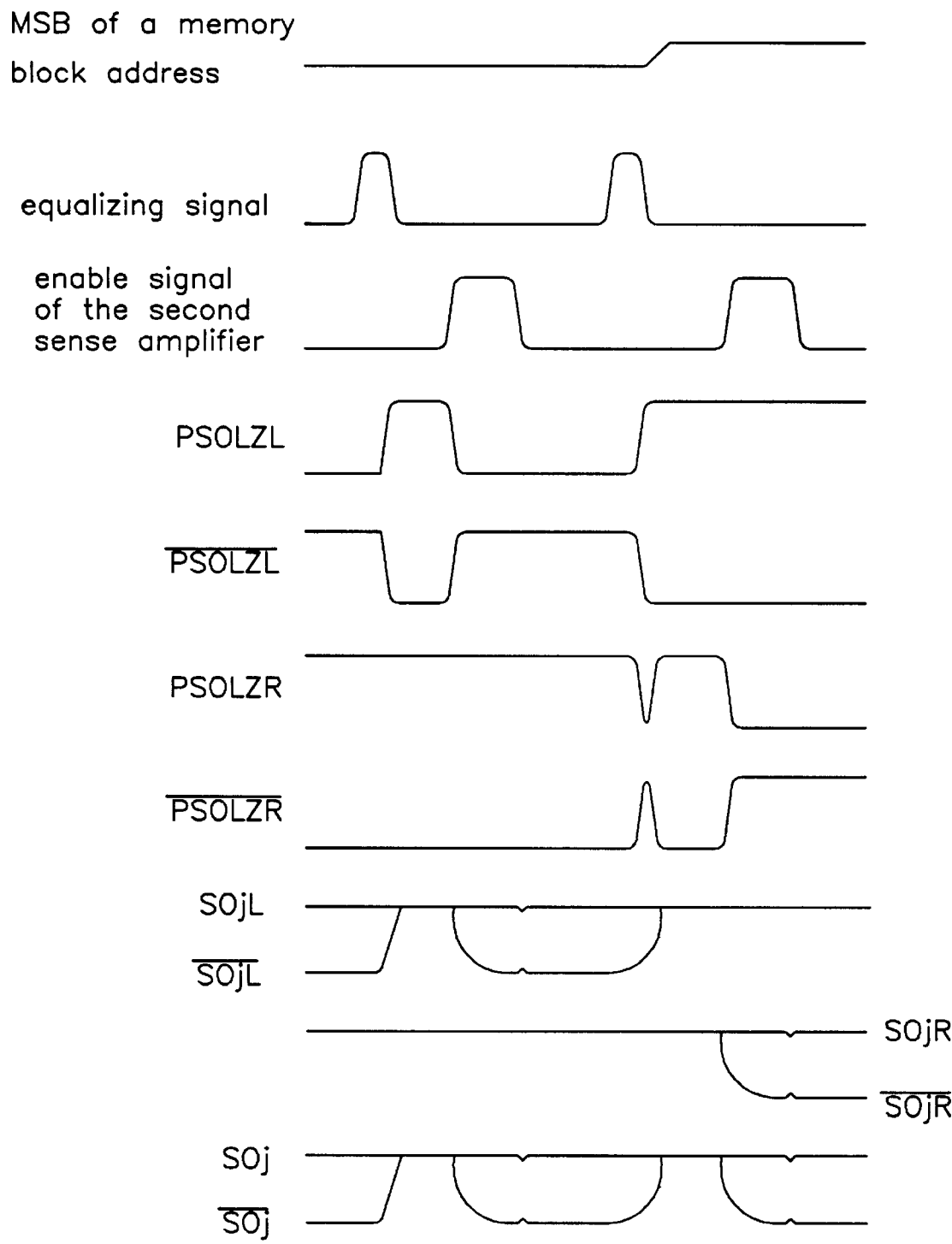
FIG. 3 is a timing diagram illustrating an operation of the 16M SRAM in FIG. 2A.

FIG. 3 is a timing diagram illustrating input and output waveforms in the data bus line load reduction circuit 2400. As shown in this drawing, the first data bus line control signal PSOLZL is "1" in logic when the most significant bit of the memory block address is "1" in logic. Also, the first data bus line control signal PSOLZL remains at its logic "1" state from a falling edge of the equalizing signal till a rising edge of the second-stage sense amplifier enable signal under the condition that the most significant bit of the memory block address is "0" in logic.

The second data bus line control signal PSOLZR is "1" in logic when the most significant bit of the memory block address is "0" in logic. Also, the second data bus line control signal PSOLZR remains at its logic "1" state from the falling edge of the equalizing signal till the rising edge of the second-stage sense amplifier enable signal under the condition that the most significant bit of the memory block address is "1" in logic.

When the first data bus line control signal PSOLZL is "0" in logic, the data bus line load reduction circuit 2400 selects the first part data bus lines SO1L–SO8L and /SO1L–/SO8L. On the contrary, when the second data bus line control signal PSOLZR is "0" in logic, the data bus line load reduction circuit 2400 selects the second part data bus lines SO1R–SO8R and /SO1R–/SO8R. That is, the data bus line load reduction circuit 2400 selects only an enabled one of the divided data bus line parts. The data bus line part, not selected, is equalized, resulting in production of no load therein. As a result, the entire data bus line load is reduced to half (50%). For example, the jth complementary bits SOj and /SOj are obtained by selectively combining the first and second part data bus line bits SOjL, /SOjL, SOjR and /SOjR in response to the first and second data bus line control signals PSOLZL and PSOLZR.

Alternatively, the most significant bit of the memory block address may be used directly as the first and second data bus line control signals PSOLZL and PSOLZR.

Also, the entire data bus line load may be reduced still more by equalizing all the data bus lines from the falling edge of the equalizing signal till the rising edge of the second-stage sense amplifier enable signal.

Further, the data bus lines may be divided into at least three parts. In this case, the data bus line control signals must properly be readjusted to select only an enabled one of the divided data bus line parts.

Figure 4:
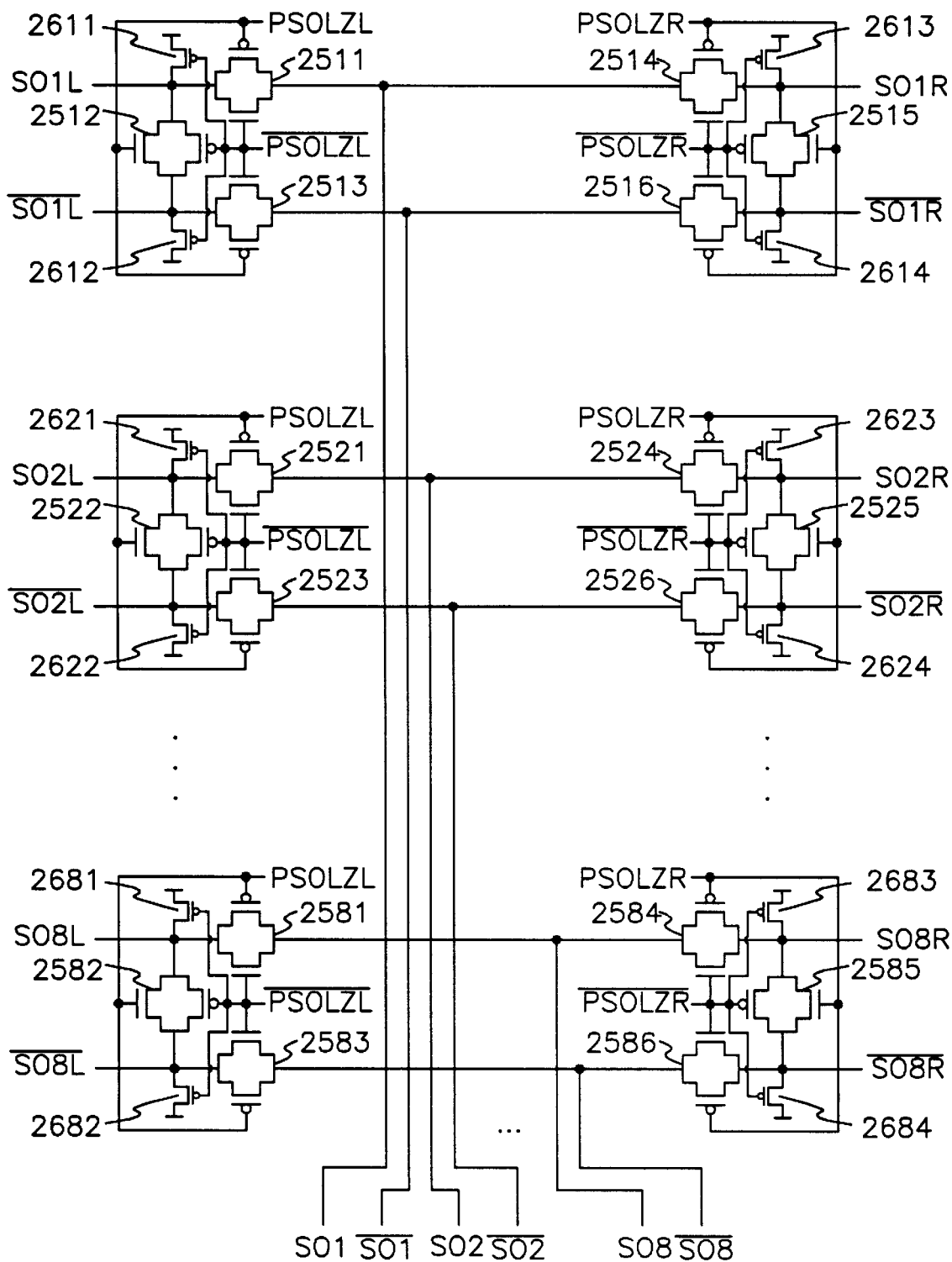
FIG. 4 is a detailed circuit diagram of a data bus line load reduction circuit in accordance with another embodiment of the present invention.

In accordance with another embodiment of the present invention, as shown in FIG. 4, additional precharge transistors 2611–2614, 2621–2624 and 2681–2684 are added to the data bus lines. These transistors may eliminate floating on the data bus lines when power is not applied to the data bus lines. In the case where power is not applied to the data bus lines, the data bus lines are equalized each other and then are in an unstable state. Accordingly, by providing these precharge transistors, the data bit lines are precharged to the Vcc voltage level with the equalization (the gate terminals of the precharge transistors are coupled to the data bus line control bar signal /PSOLZL). Further, the precharge transistors contribute to the improvement of the sense amplifier coupled thereto. Since the sense amplifier receives the voltage on the data bus line, the input voltage level is a low level. For example, when the data bus lines are equalized at 3V, the input voltage level of the sense amplifier, i.e., the voltage level on the data bus line, is at 1.5V. In this low voltage level, it is difficult to guarantee the stable operation of the sense amplifier. However, because the precharge transistors according to the present invention provide Vcc level for the input terminal, by increasing the voltage level on the data bus lines, the sense amplifier may be improved.

As apparent from the above description, according to the present invention, only a desired one of the divided data bus line parts is selected, resulting in production of no load in the data bus line part, not selected. Therefore, the entire data bus line load can significantly be reduced. In result, the present invention has the effect of increasing the data transfer speed and reducing the lay-out area of the sense amplifier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a plurality of memory blocks for storing data, and a plurality of sense amplification means for sensing the data stored in said plurality of memory blocks, comprising:

data bus lines for transferring the data sensed by said plurality of sense amplification means, said data bus lines being divided into first and second parts; and data bus line load reduction means for selecting one of said divided first and second data bus line parts in response to first and second data bus line control signals so that the selected data bus line part can input the data from one of said plurality of memory blocks selected in response to a memory block address and the other data bus line part, not selected, can have a minimized load, the first and second data bus line control signals being produced in response to a most significant bit of the memory block address, wherein said data bus line load reduction means includes:

a plurality of first switching means, each of said plurality of first switching means selecting a corresponding one of said data bus lines of said first data bus line part when the first data bus line control signal remains at its inactive state;

a plurality of second switching means, each of said plurality of second switching means selecting a corresponding one of said data bus lines of said second data bus line part when the second data bus line control signal remains at its inactive state;

a plurality of first equalizing means, each of said plurality of first equalizing means equalizing a corresponding one of said data bus lines of said first data bus line part when the first data bus line control signal remain at its active state; and a plurality of second equalizing means, each of said plurality of second equalizing means equalizing a corresponding one of said data bus lines of said second data bus line part when the second data bus line control signal remain at its active state.

2. A semiconductor memory device as set forth in claim 1, wherein said data bus lines are divided into the first and second parts on the basis of the middle of said plurality of memory blocks; and wherein the first and second data bus line control signals are the most significant bit of the memory block address.

3. A semiconductor memory device as set forth in claim 2, wherein said data bus line load reduction means further comprises a plurality of precharge means, each of said precharge means being coupled to a corresponding one of said data bus lines.

4. A semiconductor memory device as set forth in claim 3, wherein each of said precharge means comprises a PMOS transistor for precharging the corresponding one of said data bus lines.

5. A semiconductor memory device as set forth in claim 1, wherein the first and second data bus line control signals remain at their active states from a falling edge of an equalizing signal till a rising edge of a sense amplification enable signal to equalize both of said first and second data bus line parts.

6. A semiconductor memory device, comprising:

a data bus line and an inverted data bus line for transferring a data and an inverted data, respectively, said data bus line being divided into a first data bus line part and a second data bus line part, and said inverted data bus line being divided into a first inverted data bus line part and a second inverted data bus line part;

a first equalizing means coupled between said first data bus line part and said first inverted data bus line part;

a second equalizing means coupled between said second data bus line part and said second inverted data bus line part;

a first precharging means coupled to the first data bus line part;

a second precharging means coupled to the first inverted data bus line part;

a third precharging means coupled to the second data bus line part;

a fourth precharging means coupled to the second inverted data bus line part;

a first and a second switching means coupled in series between the first data bus line part and the second data bus line part; and a third and a fourth switching means coupled in series between the first inverted data bus line part and the second inverted data bus line part, wherein said first equalizing means, said first precharging means and said second precharging means are activated when the first data bus line part and the first inverted data bus line part are not selected, so as to equalize and precharge the first data bus line part and the first inverted data bus line part; and wherein said second equalizing means, said third precharging means and said fourth precharging means are activated when the second data bus line part and the second inverted data bus line part are not selected, so as to equalize and precharge the second data bus line part and the second inverted data bus line part.

7. A semiconductor memory device as set forth in claim 6, wherein the first precharging means is a first PMOS transistor whose source-drain path is coupled between a power supply potential node and the first data bus line part;

the second precharging means is a second PMOS transistor whose source-drain path is coupled between the power supply potential node and the first inverted data bus line part;

the third precharging means is a third PMOS transistor whose source-drain path is coupled between the power supply potential node and the second data bus line part; and the fourth precharging means is a fourth PMOS transistor whose source-drain path is coupled between the power supply potential node and the second inverted data bus line part.

8. A semiconductor memory device as set forth in claim 6, wherein the first equalizing means comprises a first NMOS transistor whose source-drain path is coupled between the first data bus line part and the first inverted data bus line part and a first PMOS transistor whose source-drain path is coupled between the first data bus line part and the first inverted data bus line part; and the second equalizing means comprises a second NMOS transistor whose source-drain path is coupled between the second data bus line part and the second inverted data bus line part and a second PMOS transistor whose source-drain path is coupled between the second data bus line part and the second inverted data bus line part.

9. A semiconductor memory device as set forth in claim 6, wherein each of said first, second, third and fourth switching means comprises:

a PMOS transistor whose source-drain path is coupled on a corresponding data bus line part; and a NMOS transistor whose source-drain path is coupled on the corresponding data bus line part.

* * * * *